United States Patent
Gumaste et al.

(10) Patent No.: US 7,385,297 B1
(45) Date of Patent: Jun. 10, 2008

(54) UNDER-BOND PAD STRUCTURES FOR INTEGRATED CIRCUIT DEVICES

(75) Inventors: Vijaylaxmi Gumaste, Santa Clara, CA (US); Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/274,903

(22) Filed: Nov. 14, 2005

(51) Int. Cl.
*H01L 23/52* (2006.01)
(52) U.S. Cl. .............................. 257/784; 257/E23.068
(58) Field of Classification Search ............... 257/700, 257/698, E23.068, 784
See application file for complete search history.

(56) References Cited

U.S. PATENT DOCUMENTS

| | | | |
|---|---|---|---|
| 5,866,483 A * | 2/1999 | Shiau et al. ............... | 438/720 |
| 6,255,226 B1 * | 7/2001 | Zheng et al. ............... | 438/734 |
| 6,306,750 B1 | 10/2001 | Huang et al. | |
| 6,372,661 B1 * | 4/2002 | Lin et al. ................... | 438/769 |
| 6,476,491 B2 * | 11/2002 | Harada et al. .............. | 257/758 |
| 6,803,302 B2 * | 10/2004 | Pozder et al. ............... | 438/612 |
| 2003/0020163 A1 * | 1/2003 | Hung et al. ................ | 257/734 |
| 2003/0218259 A1 * | 11/2003 | Chesire et al. ............. | 257/786 |
| 2004/0070042 A1 * | 4/2004 | Lee et al. ................... | 257/459 |

OTHER PUBLICATIONS

Heinen et al., "Wire Bonds Over Active Circuits," 1994, IEEE, pp. 922-928.
Application Note from Philips Semiconductor dated May 15, 2003.

* cited by examiner

*Primary Examiner*—Leonardo Andujar
*Assistant Examiner*—Krista Soderholm
(74) *Attorney, Agent, or Firm*—Beyer Law Group LLP

(57) ABSTRACT

An under bond pad structure is described for integrated circuit dice are that have active circuits located below at least some of the bond pads. The metallization layers interconnection structures within the die are arranged so that electrically conductive vias do not extend between the bond pads and any underlying metallization layer in a region that overlies an active circuit. In some embodiments, no conductive vias are provided between any of the metallization layers in regions that underlie the bond pads and overlie an active circuit. The described arrangements significantly improve the resistance to cracking in the dielectric layers beneath the bond pad (and particularly the topmost intermediate dielectric layer) when wire bonding is used to electrically connect such dice within a package.

19 Claims, 3 Drawing Sheets

UNDER-BOND PAD STRUCTURES FOR INTEGRATED CIRCUIT DEVICES

BACKGROUND OF THE INVENTION

The present invention relates generally to under-bond pad structures suitable for use in integrated circuit devices having active circuits located under the bond pads.

Integrated circuits typically have a number of I/O pads that facilitate electrical connection to external devices. When an integrated circuit die is packaged, the I/O pads may be electrically connected to other devices using a variety of conventional techniques. One popular electrical connection technique is wire bonding which contemplates thermosonically (or otherwise) bonding a very thin (typically gold) wire to the I/O pad (which is often referred to as a "bond pad"). Conventional wire bonding techniques impart a significant amount of stress to the bond pads and therefore cracks are often observed in dielectric layers that underlie the bond pads.

Because of the problems that may be caused by wire bonding, it is common to avoid placing active circuits in regions of the die that are positioned immediately below the bond pads. This helps reduce the risk of wire bonding causing significant degradation of active circuits within the die. However, since the bond pads occupy significant die "real estate" (i.e., a significant percentage of the total surface area of the die), prohibiting the placement of active circuits in regions below the bond pads has the undesirable side effect of increasing the required die size. Accordingly, a number of bond pad designs have been proposed and/or developed that permit active circuits to be placed below the bond pad structures. Although some of the existing structures work well for this purpose, there are continued efforts to develop improved bond pad structures for use in integrated circuits.

SUMMARY OF THE INVENTION

To achieve the foregoing and other objects of the invention an under bond pad arrangement is described that facilitates the placement of active circuits below at least some of the bond pads of an integrated circuit die. In the described arrangement, metallization layers interconnection structures within the die are arranged so that electrically conductive vias do not extend between such bond pads and an underlying metallization layer in a region that underlies the bond pad and overlies an active circuit. In some embodiments, no conductive vias are provided between any of the metallization layers in regions that underlie the bond pads and overlie an active circuit. The described arrangement significantly improves the resistance to cracking in the topmost intermediate dielectric layer beneath the bond pad when wire bonding is used to electrically connect such dice within a package.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE PREFERRED EMBODIMENTS

As will be appreciated by those familiar with the art, integrated circuits often have multiple metallization layers that overlie active circuits formed in a semiconductor substrate. The number of metallization layer used in a particular device may vary significantly based on the needs of a particular device. Currently metallization stacks that include in the range of 4-9 metallization layers are commonly used. It is suspected that in the future the use of even larger numbers of metallization layers may become common practice. Intermediate dielectric layers are typically interposed between the metallization layers to physically and electrically separate the metallization layers. Electrically conductive vias are then formed in the dielectric layers at appropriate spots in order to electrically connect specific portions of the metallization layers in desired locations.

The various metallization layers may be used as ground/power planes and/or as routing interconnects within the integrated circuit die. In most devices that have more than two metallization layers, some type of planarization (e.g. chemical mechanical polishing—CMP) is used to planarize the intermediate dielectric layers before the next metallization layer is deposited. A variety of materials may be used as the dielectric material and the metallization layers. However, aluminum and copper are currently the most commonly used materials for the metallization layers and (in silicon based devices), silicon dioxide and silicon nitride are commonly used to form the dielectric layers.

Figure 2:
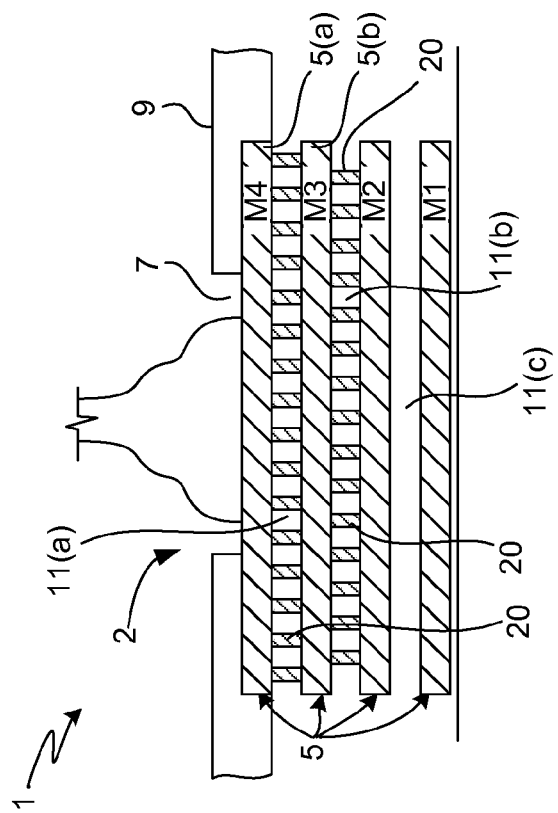
FIG. 2 is a diagrammatic cross sectional view of an integrated circuit bond pad and the underlying structures wherein vias that interconnect the upper metallization layers are positioned under the bond pad.
Figure 1:
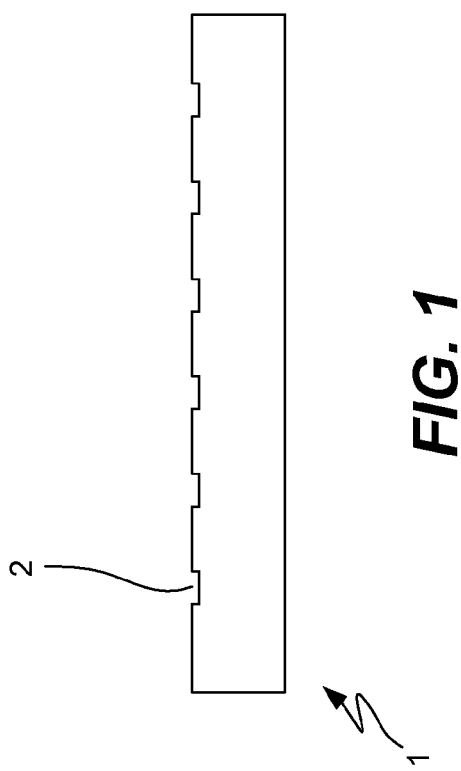
FIG. 1 is a diagrammatic cross sectional view of an integrated die having a plurality of bond pads.

Referring initially to FIGS. 1 and 2 and as will be appreciated by those familiar with the art, selected portions of the topmost metallization layer 5(a) are often exposed through various openings 7 in a passivation layer 9 on the top surface of the die 1 to form a plurality of bond pads 2 that serve as I/O contacts for the die. The bond pads may then be electrically connected to external devices using conventional techniques such as wire bonding.

In order to connect the various metallization layers 5(*a-d*), vias 20 are typically formed at various places on the die. Of particular relevance to the present invention is that one of the places that vias 20 are often formed is beneath the bond pads as illustrated in FIG. 1. Our studies have shown that after wire bonding, most semiconductor devices show cracks in the topmost intermediate dielectric layer. That is, cracks are formed in the dielectric layer 11(*a*) formed between the two uppermost metallization layers 5(*a*) and 5(*b*). Cracks are also often formed in lower intermediate dielectric layers (e.g., dielectric layers 11(*b*) or 11(*c*), etc.), although the cracking in the lower intermediate dielectric layer is typically not as severe as in the topmost intermediate dielectric layer.

If active circuits are formed beneath the bond pads, the cracking that occurs in the dielectric layers may cause current leakage and/or performance degradation. As described above, since such problems can lead to reliability and performance issues, it is common to avoid placing active circuits in regions of the die that are positioned immediately below the bond pads.

Figure 3:
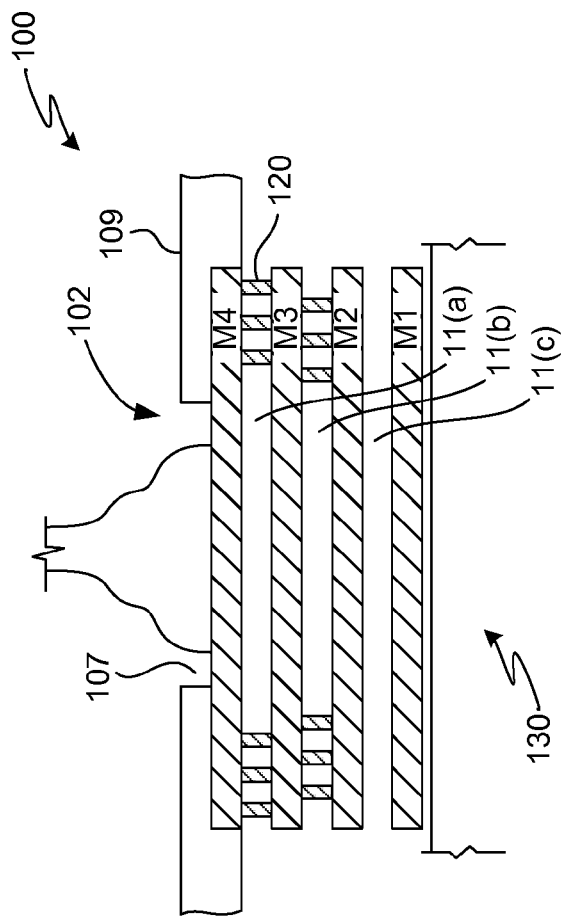
FIG. 3 is a diagrammatic cross sectional view of an integrated circuit bond pad and the underlying structures in accordance with one embodiment of the present invention wherein vias that interconnect the various metallization layers are not positioned under the bond pad that overlie active circuit areas.

Referring next to FIG. 3, a die 100 in accordance with one embodiment of the present invention will be described. In this embodiment active circuits 130 are formed in a region that is below the bond pad 102. However, unlike the arrangement illustrated in FIG. 2, there are no vias 120 that are located below the bond pad 102. Rather, the vias 120 are positioned under the passivation layer 109 to the side of the passivation opening 107 that defines the bond pad 102. Our experiments show that devices incorporating such a structure have significantly lower under bond pad stresses after wire bonding than the more traditional via placements such as the arrangement diagrammatically illustrated in FIG. 2. Accordingly, they are significantly less prone to undesirable cracking.

In the embodiment illustrated in FIG. 3, no vias 120 whatsoever are located beneath the bond pad 102. However, our experiments have led us to believe the biggest problems are caused by the use of vias 120 in the uppermost intermediate dielectric layer 111(*a*). Therefore, improvements can also be made by simply eliminating vias that actually contact the bond pad in the region where wire bonding will occur. That is, improvements can be made by redistributing vias between the two uppermost metallization layers regardless of whether vias between lower level metallization layers are redistributed. In such an arrangement, the vias 120 between the two uppermost metallization layers are located to the side of the bond pad in regions outside of the passivation opening 107 that defines the bond pad 102. One such arrangement is diagrammatically illustrated in FIG. 4.

In the embodiment illustrated in FIG. 4, vias between the two uppermost metallization layers are located to the side of the bond pad, while the vias between the second and third uppermost metallization layers are distributed in a more conventional manner below the bond pad. For illustrative purposes, in the embodiments shown only three of four metallization layers are electrically coupled by vias in the region of the bond pad. However, it should be apparent that the number of metallization layers that are provided as well as the logic of the interconnection structures (i.e., which metallization layers are electrically coupled in the region under the bond pad) may be widely varied.

Figure 4:
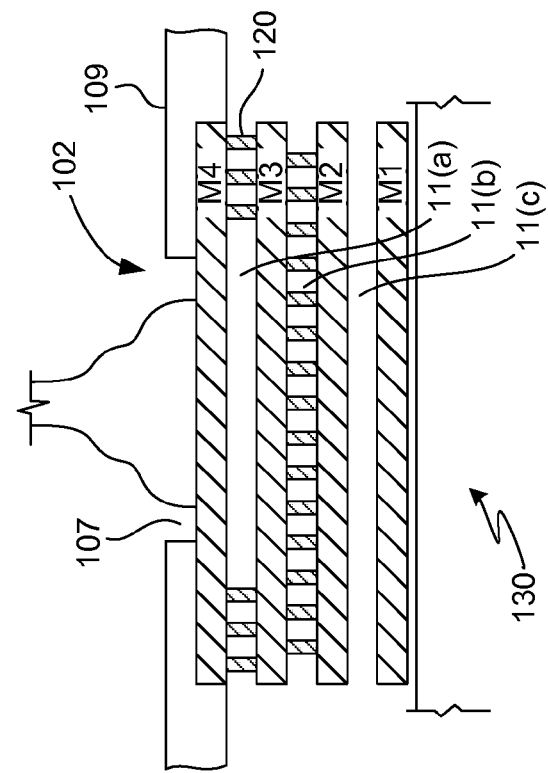
FIG. 4 is a diagrammatic cross sectional view of an integrated circuit bond pad and the underlying structures in accordance with another embodiment of the present invention wherein vias that interconnect the upper two metallization layers are not positioned under a bond pad that overlies active circuit areas but vias between lower level metallization layers are.

Although the embodiment shown in FIG. 4 only redistributes the under bond pad vias that interconnect the two uppermost metallization layers, it should be appreciated that further benefits can be obtained by also redistributing the under bond pad vias that interconnect lower layers as well (e.g., the vias that interconnect the second and third uppermost metallization layers; the vias that interconnect the third and fourth uppermost metallization layers, etc.).

Figure 5:
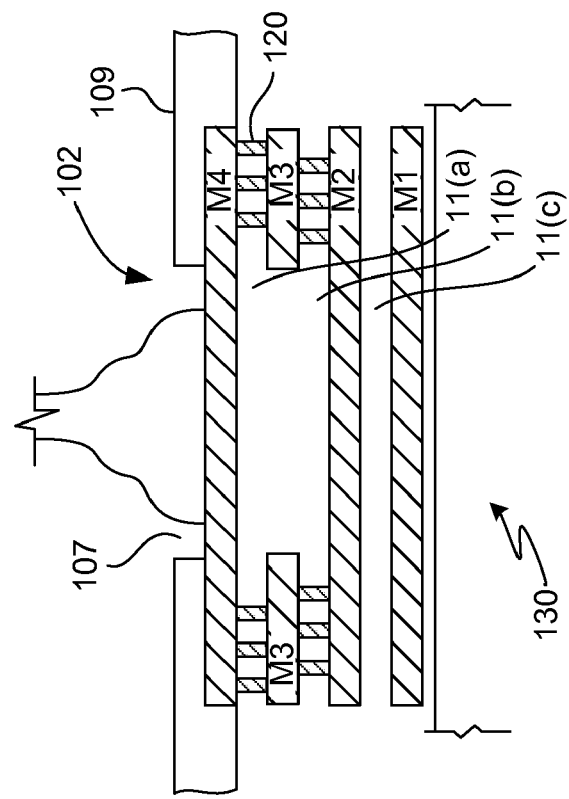
FIG. 5 is a diagrammatic cross sectional view of an integrated circuit bond pad and the underlying structures in accordance with another embodiment of the present invention wherein portions of the second topmost metallization layer that underlie the bond pads have been eliminated.

Referring next to FIG. 5, another arrangement will be described. In this arrangement, the vias that interconnect the two uppermost metallization layers are redistributed such that they are positioned under the passivation layer outside the footprint of the bond pad. The vias that interconnect the second and third uppermost metallization layers are also redistributed from the center region of the bond pad. Additionally, the portions of the second uppermost metallization layer that would underlie the bond pads are eliminated. It has been observed that cracking between the two uppermost metallization layers may sometimes cause undesirable shorting. In this embodiment, elimination of the portions of the second uppermost metallization layer that underlie the bond pad results in a much thicker dielectric layer between the bond pad and the closest underlying metallization layer (which is the third uppermost metallization layer in the illustrated embodiment). The increased dielectric thickness reduces the probability of cracks causing undesirable shorting or other failures. Of course, the elimination of the portions of metallization layers that lie directly below the bond pads can be advantageously applied to lower level metallization layers as well.

Figure 6:
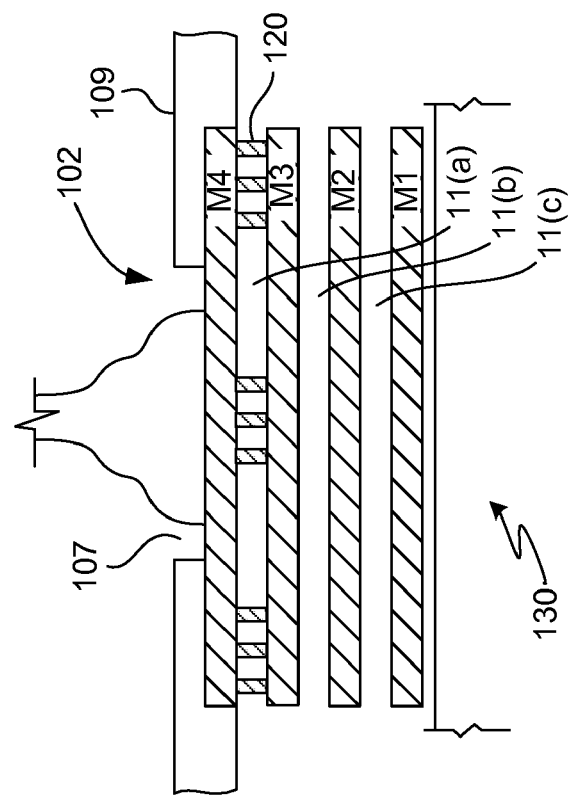
FIG. 6 is a diagrammatic cross sectional view of an integrated circuit bond pad and the underlying structures in accordance with another embodiment wherein any vias that must be retained between the bond pad and an underlying layer are positioned in a central region of the bond pad that is arranged to underlie an associated ball bond.

Although the redistribution of the vias described above are quite desirable, there are some situations where available die real estate or other concerns may make it unpractical or difficult to redistribute all of the vias that might contact the bond pad. Referring next to FIG. 6 yet another embodiment will be described that helps address these situations. In this embodiment, the majority of the vias that might normally underlie and contact the bond pad are redistributed to locations under the passivation layer. However, some vias are permitted underneath the very central region of the bond pad. Our experiments have shown that cracking tends to be significantly worse around the peripheral portions of a ball bond. Additionally, such cracks tend to propagate primarily outward (i.e., radially away from the central portion of the ball bond rather radially towards the central region) as they propagate from an upper metallization layer (e.g., the topmost metallization layer) towards a lower metallization layer. Thus, although cracking may occur at any location on the bond pad, statistically, the cracking tend to be less sever around vias that are located under the center portion of the ball bond. Accordingly, in the embodiment shown in FIG. 6, any vias between the two uppermost metallization layers that must be retained in a region underneath the bond pads are positioned in a central region of the bond pad so that they will underlie a central region of the associated ball bond. It has been observed that such an arrangement helps reduce under bond pad cracking problems. The provision of some vias under the bond pad also helps reduce contact resistance (relative to embodiments that don't have any vias under the bond pad) from the bond pad to the remaining circuits by providing more parallel connection paths.

It is noted that in some older processes that utilize just two metallization layers and no active circuitry below the bond pad, aluminum vias have been used to interconnect the metallization layers. It is believed that these aluminum vias were typically formed by etching openings in the dielectric layer formed over the lower metallization layer and conformally depositing the upper metallization layer over the dielectric layer without planarizing either the dielectric layer or the upper metallization layer. In such arrangements, it is believed that the aluminum vias would typically not be positioned underneath the bond pad, in part because the vias which were effectively part of the conformal upper metallization layer made a poor wire bonding surface.

Although only a few embodiments of the invention have been described in detail, it should be appreciated that the invention may be implemented in many other forms without departing from the spirit or scope of the invention. In the illustrated embodiments, only a few metallization layers are shown. However, it should be appreciated that the principles of the present invention may be applied regardless of the number of metallization layers that are used in a particular chip design. Also, for illustrative purposes, the metallization layers beneath the bond pad are in most circumstances shown as being continuous in the region beneath the bond pad. As will be appreciated by those familiar with the art, in many cases that may not be the case because the metallization layers often involve routing. In such cases, the positioning of the vias is selected to insure that they make the appropriate electrical connections.

The vias may be formed from any suitable conductive material. Currently, tungsten is the material that is most commonly used to form the vias. However, it should be appreciated that other materials may be used as well. In current processes, the dielectric layers are typically planarized before deposition of the next overlying metallization layer. Such an arrangement is helpful in the formation of high quality vias. However, if improved conformal metallization layer formation techniques are developed, it is expected that the concepts of the invention may be applied to such devices as well. Therefore, the present embodiments are to be considered as illustrative and not restrictive and the invention is not to be limited to the details given herein, but may be modified within the scope and equivalents of the appended claims.

What is claimed is:

1. An integrated circuit die comprising:
a plurality of active circuits;
a multiplicity of vertically separated metallization layers that are separated by dielectric layers, each of the metallization layers being formed from the same material;
a plurality of bond pad structures that function as I/O pads for the die, the bond pad structures being formed from a part of a first one of the metallization layers, each bond pad structure being exposed through an associated opening in a passivation layer to define a bond pad, wherein the bond pad structures do not have any dielectric layers formed within the bond pad structures, and wherein at least some of the bond pad structures have active circuits positioned below the associated bond pad and whereby the bond pad defines a wire bonding surface that is suitable for wire bonding and directly supporting a bonding wire; and
a plurality of electrically conductive vias, each via being arranged to pass through an associated one of the dielectric layers to electrically interconnect a pair of metallization layers, wherein the vias are arranged so that none of the vias that are coupled to the first metallization layer are positioned below any of the bond pads in a region that overlies any of the active circuits.

2. An integrated circuit die comprising:
a plurality of active circuits;
a multiplicity of vertically separated metallization layers that are separated by dielectric layers;
a plurality of bond pad structures that function as I/O pads for the die, the bond pad structures being formed from a part of a first one of the metallization layers, each bond pad structure being exposed through an associated opening in a passivation layer to define a bond pad, wherein the bond pad structures do not have any dielectric layers formed within the bond pad structures, and wherein at least some of the bond pad structures have active circuits positioned below the associated bond pad and whereby the bond pad defines a wire bonding surface that is suitable for wire bonding and directly supporting a bonding wire; and
a plurality of electrically conductive vias, each via being arranged to pass through an associated one of the dielectric layers to electrically interconnect a pair of metallization layers, wherein the vias are arranged so that none of the vias are positioned below any of the bond pads in a region that overlies any of the active circuits.

3. An integrated circuit die as recited in claim 1 wherein there are at least three metallization layers and the first metallization layer is the topmost metallization layer.

4. An integrated circuit die as recited in claim 1 wherein there are at least four metallization layers.

5. An integrated circuit die as recited in claim 1 wherein the dielectric layers between the metallization layers are each planarized.

6. An integrated circuit die as recited in claim 1 wherein the vias are formed at least in part from Tungsten.

7. An integrated circuit die as recited in claim 2 wherein none of the vias are positioned below any of the bond pads.

8. An integrated circuit die as recited in claim 3 wherein none of the vias are positioned below any of the bond pads.

9. An integrated circuit die as recited in claim 1 wherein there are at least three metallization layers.

10. An integrated circuit die as recited in claim 1 wherein the vias are formed at least in part from aluminum.

11. A packaged integrated circuit comprising:
an integrated circuit die having a plurality of active circuits, a multiplicity of vertically separated metallization layers, a plurality of planarized dielectric layers that separate the metallization layers, a plurality of electrically conductive vias that are each arranged to pass through an associated one of the dielectric layers to electrically interconnect a pair of metallization layers, a plurality of bond pad structures that function as I/O pads for the die and a passivation layer, wherein the bond pad structures are formed at least in part from a first one of the metallization layers, each bond pad structure being exposed through an associated opening in the passivation layer to define a bond pad, wherein the bond pad structures do not have any dielectric layers formed within the bond pad structures, and wherein at least some of the bond pad structures have active circuits positioned below the associated bond pad;
a plurality of bonding wires, wherein at least some of the bonding wires are bonded to associated bond pads; and
wherein the vias are arranged so that none of the vias that are coupled to the first metallization layer are positioned below any of the bond pads in a region that underlies a bonding wire and overlies an active circuit.

12. A packaged integrated circuit comprising:
an integrated circuit die having a plurality of active circuits, a multiplicity of vertically separated metallization layers, a plurality of planarized dielectric layers that separate the metallization layers, a plurality of electrically conductive vias that are each arranged to pass through an associated one of the dielectric layers to electrically interconnect a pair of metallization layers, a plurality of bond pad structures that function as I/O pads for the die and a passivation layer, wherein the bond pad structures are formed at least in part from a first one of the metallization layers, each bond pad structure being exposed through an associated opening in the passivation layer to define a bond pad, wherein the bond pad structures do not have any dielectric layers formed within the bond pad structures, and wherein at least some of the bond pad structures have active circuits positioned below the associated bond pad;

a plurality of bonding wires, wherein at least some of the bonding wires are bonded to associated bond pads; and wherein the vias are arranged so that none of the vias are positioned below any of the bond pads in a region that overlies any of the active circuits.

13. An integrated circuit die as recited in claim 11 wherein:

there are at least four metallization layers; and the first metallization layer is the topmost metallization layer.

14. An integrated circuit die as recited in claim 12 wherein none of the vias are positioned below any of the bond pads.

15. An integrated circuit die comprising:

a plurality of active circuits;

a multiplicity of vertically separated metallization layers that are separated by dielectric layers, there being at least three metallization layers;

a plurality of bond pad structures that function as I/O pads for the die, the bond pad structures being formed at least in part from a first one of the metallization layers, each bond pad structure being exposed through an associated opening in a passivation layer to define a bond pad, wherein the bond pad structures do not have any dielectric layers formed within the bond pad structures, and wherein at least some of the bond pad structures have active circuits positioned below the associated bond pad; and a plurality of electrically conductive vias, each via being arranged to pass through an associated one of the dielectric layers to electrically interconnect a pair of metallization layers, wherein the vias are arranged so that none of the vias that are coupled to the first metallization layer are positioned below any of the bond pads in a region that overlies any of the active circuits except for vias that are located below a central region of the bond pad that would be positioned below a central region of the expected position of a wire bonding ball bond that may be used to help electrically connect the bond pad to other devices.

16. An integrated circuit die comprising:

a plurality of active circuits;

a multiplicity of vertically separated metallization layers that are separated by dielectric layers;

a plurality of bond pad structures that function as I/O pads for the die, the bond pad structures being formed from a part of a first one of the metallization layers, each bond pad structure being exposed through an associated opening in a passivation layer to define a bond pad, wherein the bond pad structures do not have any dielectric layers formed within the bond pad structures, and wherein at least some of the bond pad structures have active circuits positioned below the associated bond pad and whereby the bond pad defines a wire bonding surface that is suitable for wire bonding and directly supporting a bonding wire; and a plurality of electrically conductive vias, each via being arranged to pass through an associated one of the dielectric layers to electrically interconnect a pair of metallization layers, wherein the vias are arranged so that none of the vias that are coupled to the first metallization layer are positioned below any of the bond pads in a region that overlies any of the active circuits and wherein the metallization layer immediately adjacent to the first metallization layer does not exist under any of the bond pads that overlie any of the active circuits.

17. An integrated circuit die as recited in claim 16, wherein there are no portions of the metallization layers other than the first metallization layer below any of the bond pads that overlie any of the active circuits.

18. A packaged integrated circuit comprising:

an integrated circuit die as recited in claim 16; and a plurality of bonding wires, wherein at least some of the bonding wires are bonded to associated bond pads.

19. A packaged integrated circuit as recited in claim 18, wherein there are no portions of the metallization layers other than the first metallization layer below any of the bond pads that overlie any of the active circuits.

* * * * *